(12) United States Patent
Ng et al.

(10) Patent No.: US 6,921,927 B2
(45) Date of Patent: Jul. 26, 2005

(54) SYSTEM AND METHOD FOR ENHANCED LED THERMAL CONDUCTIVITY

(75) Inventors: Kee Yean Ng, Penang (MY); Sundar A. L. N. Yoganandan, Penang (MY)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/650,892

(22) Filed: Aug. 28, 2003

(65) Prior Publication Data

US 2005/0045902 A1 Mar. 3, 2005

(51) Int. Cl.[7] .......................... H01L 33/00; H01L 23/36
(52) U.S. Cl. ..................... 257/99; 257/100; 257/459; 257/707; 257/745
(58) Field of Search ........................ 257/99, 100, 707, 257/745, 459

(56) References Cited

U.S. PATENT DOCUMENTS 6,335,548 B1 * 1/2002 Roberts et al. ............... 257/98
6,518,600 B1 * 2/2003 Shaddock .................... 257/98
6,521,916 B2 * 2/2003 Roberts et al. .............. 257/100

OTHER PUBLICATIONS

Fiber Optic Components, Light–Emitting Diode (LED), pp. 1–8, retrieved from internet—http://www.fiber–optics.info/articles/LEDs.htm—May 12, 2003.

* cited by examiner

Primary Examiner—Jerome Jackson

(57) ABSTRACT

A light emitting device assembly comprises a light emitting diode (LED) chip, a substrate with two terminals, at least one encapsulation layer, and a thermally conductive adhesive to connect the LED chip and the substrate. The first terminal of the substrate is comprised of a portion with a width at least as wide as the LED chip and a vertical cross-sectional area of at least 30% of the total vertical cross-sectional area of the encapsulated assembly, and a straight element. The enlarged first terminal portion provides more area for heat dissipation and conduction, and along with the thermally conductive adhesive and the encapsulation package, provide enhanced thermal conductivity.

18 Claims, 2 Drawing Sheets

SYSTEM AND METHOD FOR ENHANCED LED THERMAL CONDUCTIVITY

TECHNICAL FIELD

This invention relates to electronic devices, and more specifically to light emitting diodes (LEDs) with enhanced heat dissipation properties.

BACKGROUND OF THE INVENTION

Light emitting diodes (LEDs) are complex solid state semiconductor devices that are specially constructed to release a large number of photons outward thereby converting electrical energy into light. LEDs are generally preferred over incandescent lamps due to their small size, durability, and long life. Additionally, LEDs are preferred over incandescent lamps because less heat is emitted in the conversion of electrical energy into light.

LED lamps are widely used in a variety of applications such as video signals, traffic signal heads, and automotive brake lights. Furthermore, LEDs are found in a variety of consumer electronics products and serve as visible indicators in equipment such as televisions, VCRs, and car electronics. Often LEDs act as a "pilot" light in many electronics appliances to indicate if a circuit is closed. Furthermore, LEDs are popular for board assemblers in the electronics industry as they are quite suitable for high volume assembly using widely available auto-insertion equipment.

During operation of the light emitting device assembly, current passes through the LED via the two terminals of a substrate. The LED will then be illuminated when electrical energy has been converted into light energy. This conversion from electrical to light energy typically will not be 100% efficient, and as a result, some heat will be produced in this conversion process.

When the LED begins to conduct, the assembly undergoes a gradual increase in voltage while the current flow rapidly increases. A forward voltage of approximately 1.9 V usually is necessary to produce a forward current, in the direction of its greatest conduction, of approximately 20 mA. Naturally, the voltage at 20 mA is dependent on the type of semiconductor material that is used to fabricate the LED. For example, an aluminum indium gallium phosphide (AlInGaP) LED needs 1.9 V while an indium gallium nitride (InGaN) LED needs 3.4 V. The forward-biasing voltage causes electrons and holes to enter the depletion region and recombine; the external energy provided by this voltage excites electrons at the conduction band, which then fall to the valence band and recombine with the holes, resulting in light radiation in the visible spectrum.

In order to maximize the number of photons emitted by the LED and thus produce more light, the forward current needs to be maximized. As the forward current increases, more electrons will be excited at the conduction band and more photons will be emitted. The light that is emitted by the LED is directly proportional to the current running through the LED. Even with the linearity of light output and current, the emission curve of the LED experiences a drop in efficiency as the operating temperature of the LED increases due to the self-heating of the LED as it is driven to higher currents as depicted in FIG. 2; furthermore, the conversion efficiency also experiences a drop. Accordingly, this process suffers from the disadvantage that as the drive current increases, more heat is produced. Light performance of a LED is of greatest importance, and in order to maintain the light performance, the heat produced must then be removed.

In the LED industry, thermal resistance is used to designate the heat transfer ability of the device as a whole. For example, a 5 mm through-hole lamp typically has a thermal resistance (junction to pin) of 240° C./W, indicating that if the LED dissipates 1 W of heat, there is a temperature difference between the LED and the point in the pin of 240° C. Thus, it would be desirable to improve the thermal resistance in order to maximize heat extraction in these devices.

As a specific example of implementation of the prior art design, a LED chip is affixed to a substrate, usually a leadframe, using a type of electrically conductive adhesive. The substrate is comprised of two terminals extending in the axial direction, a portion of the first terminal being composed of a cavity and a straight element. An electrical connection is then made between the LED chip and a second terminal of the substrate. An optically clear epoxy encapsulates the assembly.

As a further example of implementation of the prior art design, U.S. Pat. No. 6,518,600 discloses dual encapsulation layers for an LED. The first encapsulation layer is transparent to light or radiation, and the second encapsulation layer has high thermal conductivity in order to decrease the operating temperature of the LED. Although the dual encapsulation layers will improve thermal conductivity to a degree, there is a need to further enhance heat extraction from the LED.

Heat removal typically is limited to conduction down the first terminal of the substrate. Since the vertical cross-sectional area of the first portion of the first terminal typically does not comprise more than 30% of the total vertical cross-sectional area of the encapsulated assembly, it generally is difficult to conduct much heat away from the LED. Accordingly, in the past, these devices have been limited to a maximum forward current of approximately 50 mA or less (usually in the range of 10–40 mA). Thus, these parameters result in a less efficient and less high performing LED than is desirable. Since LEDs are becoming widely used, there is a need to extend the performance of these devices by finding a way to enhance heat extraction from the LED.

BRIEF SUMMARY OF THE INVENTION

Embodiments of the present invention provide a light emitting device assembly comprising a light emitting diode (LED) chip, a substrate, preferably a leadframe, having two terminals, one terminal having a portion with a width that is at least as wide as the LED chip and a vertical cross-sectional area of at least 30% of the total vertical cross-sectional area of the encapsulated assembly, a cavity to house the LED chip, and a metal-based adhesive connecting the LED chip and the substrate. At least one encapsulation layer serves to encase the assembly. Preferably, a first layer encapsulant with enhanced thermal conducting properties encases the enlarged first terminal portion, and a second layer optically clear encapsulant is affixed to the first layer encapsulant to encase the remainder of the assembly.

Embodiments of the present invention provide a method for enhancing heat dissipation properties of a light emitting device assembly, the method comprising positioning the LED chip within a cavity of a first terminal, the first terminal having a portion with a width that is at least as wide as the LED chip and a vertical cross-sectional area of at least 30% of the total vertical cross-sectional area of the encapsulated assembly, attaching the LED chip to the first terminal of the substrate with metal-based adhesive, positioning a second terminal of the substrate in proximity to the first terminal, and attaching the LED to the second terminal of the substrate. The method further comprises encasing the enlarged portion of the first terminal with a first layer encapsulant and aligning a second layer encapsulant with respect to the first layer encapsulant to encapsulate the remainder of the assembly. Additional embodiments of the method provide for incorporating fillers into the first layer encapsulant to further enhance thermal conductivity of the assembly.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

The present invention is directed to a system and method for providing a light emitting device assembly with enhanced heat dissipation properties.

Embodiments of the present invention utilize a substrate and LED chip connected using a metal-based adhesive in place of an epoxy-based adhesive. The substrate utilized in the present invention is comprised of two terminals, one terminal having a portion with a width at least as wide as the LED chip, preferably with a vertical cross-sectional area of at least 30% of the total vertical cross-sectional area of the encapsulated assembly. The enlarged first terminal portion is then encased by a first layer encapsulant with enhanced thermal conducting properties. A second layer optically clear encapsulant is then attached to the first layer encapsulant on one side so as to encase the remainder of the assembly. Alternatively, a shell or mold is used, wherein the substrate connected to the LED chip is placed inside the shell and the second layer encapsulant is poured into the shell, followed by the first layer encapsulant. The first and second layer encapsulants solidify, taking the shape of the shell, to encase the remainder of the assembly.

Figure 4:
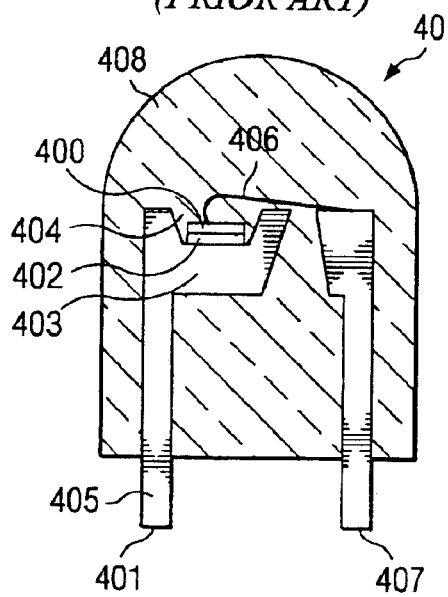
FIG. 4 depicts a prior art light emitting device assembly.

Before discussing the preferred embodiment, it might be helpful to review a prior art device 40 as illustrated in FIG. 4. In the prior art design, the substrate, typically a leadframe with cavity 404, connects to LED chip 400 and is comprised of two terminals, first terminal 401 having first portion 403 and straight element 405, and second terminal 407 connected to first terminal 401 via electrical connection 406. First portion 403 of first terminal 401 typically comprises only 30% of the total vertical cross-sectional area of the encapsulated assembly in which first terminal portion 403 is embedded, and the area available for heat dissipation from LED chip 400 is reduced. Utilizing electrically conductive adhesive 402, LED chip 400 is then affixed to first terminal 401 of the substrate. The electrically-conductive adhesive is typically epoxy-based, which lends to poor thermal conductivity and a large amount of heat production. Thus, heat given off by LED 400 remains in first portion 403 of first terminal 401, in that there is minimal area for heat transfer to occur. At least one encapsulation layer 408 is used to encase light emitting device assembly 40.

Figure 1:
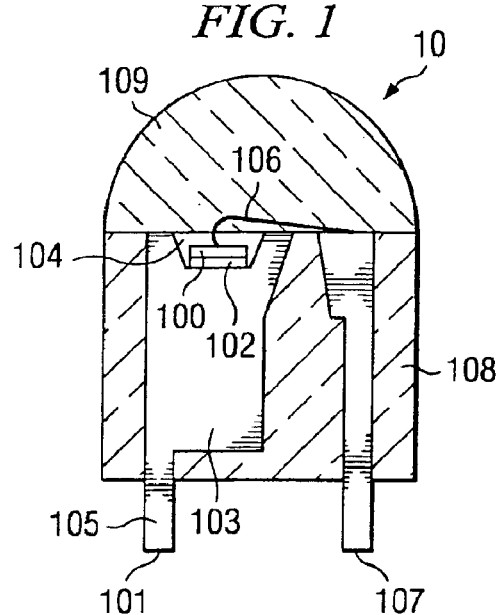
FIG. 1 depicts a light emitting device assembly according to an embodiment of the present invention.
Figure 2:
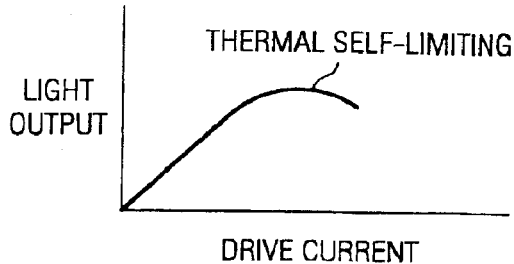
FIG. 2 depicts the emission characteristics of a typical LED.

As shown in FIG. 1, in one embodiment, light emitting device assembly 10 has LED chip 100 attached to first terminal 101 of a leadframe advantageously using metal-based adhesive 102. Such metal-based adhesive provides good thermal conductivity between LED 100 and portion 103 of first terminal 101 of the substrate. This is in contrast to the poor conductivity of epoxy-based adhesive 402 in the prior art (FIG. 4). First terminal 101 includes portion 103 having cavity 104 to house LED chip 100 and to collect light from LED chip 100. Such portion 103 will be at least as wide as the width of LED chip 100. The vertical cross-sectional area of portion 103 of first terminal 101 will typically comprise at least 30% of the total vertical cross-sectional area of the encapsulated assembly in which first terminal portion 103 is embedded. If the size of encapsulation package 108 is fixed, such portion 103 typically may be enlarged to the point that it is flush with an edge of encapsulation package 108. However, alternative embodiments may provide for portion 103 of first terminal 101 to protrude out of encapsulation package 108 such that portion 103 may then be placed in contact with metal, such as a metal pad of a PCB. As the metals are placed in contact, thermal conductivity then increases.

Typically, the diameter of the base of the dome-shaped portion of encapsulation package 109 or the diameter of the cylindrical portion of encapsulation package 109 will be either 3 mm, 4 mm, or 5 mm. Thus, these types of LED packages are called 3 mm, 4 mm, or 5 mm through-hole lamps, indicating that the straight elements of the first and second terminals are inserted into holes of a component, such as a mounted PCB. Although other encapsulation package sizes are possible, they are uncommon and likely do not meet industry standards. Thus, the cylindrical part of package 109 may be extended, typically in a vertical orientation, but the diameter of package 109 will remain constant. Accordingly, it should be appreciated that in determining a ratio between the vertical cross-sectional area of first terminal portion 103 and the total vertical cross-sectional area of the encapsulated assembly, the ratio may vary due to an increase in area of encapsulation package 108.

In the prior art, when a 5 mm through-hole lamp is used, portion 403 of first terminal 401 would have an area of approximately 0.00996 in$^2$; however, in a preferred embodiment, portion 103 of first terminal 101 has an area of at least 0.014 in$^2$, representing an increase in area of about 41%. Because the area of portion 103 has expanded, more metal is placed in contact with encapsulation package 108, and the amount of heat dissipation also increases. It should be appreciated, however, that the area of first terminal portion 403 will change depending on the diameter of the through-hole lamp that is used. For example, when a 3 mm through-hole lamp is used, the calculated area may be less than with a 5 mm lamp, but a similar percent increase may be realized.

Further, first terminal 101 includes straight element 105 as an extension of first terminal portion 103. As element 105 of first terminal 101 occupies less area than portion 103 of first terminal 101, more area is available to enlarge first terminal portion 103, but only to the extent that first terminal portion 103 and second terminal 107 do not touch, in order to avoid electrical shorts in light emitting device assembly 10. It should be appreciated that the dimensions of second terminal 107 and straight element 105 of first terminal 101 remain constant, given that these elements fit into a component wherein holes for placement of the terminals are fixed, such as in a PCB. If portion 103 of first terminal 101 is enlarged, accordingly, less of straight element 105 will be embedded in encapsulation package 108, providing more area in which heat can dissipate prior to reaching straight element 105 and then entering into a PCB, for example.

Heat conduction is represented by the equation: $Q/t = kA(T_{hot} - T_{cold})/d$ where $Q/t$ is rate of heat transfer, k is thermal conductivity, A is the normal cross-sectional area, $T_{hot}$ is temperature at hot end, $T_{cold}$ is temperature at cold end, and d is thickness of material used. The rate of heat transfer is proportional to thermal conductivity and normal cross-sectional area. When first terminal 101 is enlarged, the rate of heat transfer is expedited because the horizontal cross-sectional area has increased. Assuming that a 5 mm through-hole lamp is used, in the prior art, straight element 405 of first terminal 401 typically has a horizontal cross-sectional area of 0.0004 in$^2$; however, in a preferred embodiment, first terminal 101 is increased in area by 0.00112 in$^2$, representing an increase in area of approximately 280%. Thus, increased area is available for heat dissipation down to a PCB. Although the entrance point for straight element 105 of first terminal 101 is fixed, when first terminal portion 103 is enlarged, it is possible for more heat to dissipate in first terminal 101 before heat reaches this insertion point in the PCB. It should be appreciated, however, that the area of enlarged first terminal portion 103 will change depending on the package diameter of through-hole lamp that is used.

Additionally, to increase thermal conductivity of light emitting device assembly 10 and to allow the substrate to sink more heat from LED chip 100, alternative embodiments provide for increasing the thickness of all metal elements in assembly 10, including, but not limited to, the entirety of first terminal 101 and second terminal 107. Thickness may preferably be increased by the addition of more bulk material, generally metal, to increase thermal capacity of assembly 10. Alternatively, the increase in thickness may be selectively confined to portion 103 of first terminal 101.

By increasing the overall area of first terminal 101, the amount of metal in contact with encapsulation package 108 will accordingly increase. Thus, if encapsulation package 108 has good thermal conductivity and portion 103 of first terminal 101 makes more contact with encapsulation package 108, accordingly, heat dissipation for LED assembly 10 will improve.

An electrical connection, usually gold wire 106, is made between one end of LED 100 to second terminal 107 of the leadframe. The leadframe is then encased in at least one encapsulation layer 108, 109. Preferably, this leadframe is encased in first layer encapsulant 108 which envelops portion 103 of first terminal 101 but typically excludes the internal part of cavity 104 up to a level, approximately the top of portion 103 of first terminal 101. A second layer optically clear encapsulant 109 is laid on first layer encapsulant 108 on one side to encase cavity 104. Second layer encapsulant 109 is typically constructed in the shape of a lens. Alternatively, dual encapsulation may be achieved by use of a shell or mold. LED chip 100 is connected to substrate and then placed in such a shell. Second layer encapsulant 109 is then poured into the shell followed by first layer encapsulant 108. These encapsulants 108, 109 solidify, taking the shape of the shell, to encase the remainder of the assembly.

In a preferred embodiment of the present invention, at least one encapsulation layer 108, 109 encases light emitting device assembly 10. However, preferably dual encapsulation layers 108, 109 serve to enhance heat dissipation in assembly 10.

In such a dual encapsulation system, first layer encapsulant 108 has enhanced thermal conductivity and acts as a thermal dissipater when it is in contact with portion 103 of first terminal 101. First layer encapsulant 108 is usually a polymer-based encapsulant that is comprised of thermally conductive fillers in order to enhance thermal conductivity. Fillers for first layer encapsulant 108 may include ceramic, glass, or aluminum particles. Each of these filler options may result in a significant improvement in thermal conductivity. For example, an epoxy-based encapsulant lacking a filler typically has a thermal conductivity of about 0.2 W/mK, but when suitable fillers are added to encapsulant 108, thermal conductivity may be improved to at least 10–20 W/mK. With this addition of fillers, it is not necessary for first layer encapsulant 108 to be transparent. First layer encapsulant 108 could be semi-transparent or opaque without loss of device performance. Second layer encapsulant 109 preferably is optically clear such that it is transparent to LED light or radiation.

The dual encapsulation feature preferably incorporated in light emitting device assembly 10 may be omitted in favor of a single encapsulant; however, the prior art indicates that dual encapsulation provides for a 21.5% lower thermal resistance than LEDs that are singly encapsulated. Taking into account variations in measurement that may occur, at least a 10%, and preferably an 11–21.5% reduction in thermal resistance may result from dual encapsulation. Accordingly, use of dual encapsulation layers improves thermal conductivity, and the amount of heat extracted from the LED may be further increased by employing a metal-based adhesive as well as by enlarging portion 103 of first terminal 101.

Metal-based adhesive 102 on the leadframe affixing first terminal portion 103 to LED chip 100 is preferably a solder alloy, usually a tin-based or gold-based alloy. However, a single element such as indium may also be preferably employed as such an adhesive. A metal-based adhesive provides better thermal conductivity between LED 100 and portion 103 of first terminal 101 when compared to an epoxy-based adhesive. Accordingly, approximately one order of magnitude improvement in conductivity may be obtained from the substitution. For example, an epoxy-based adhesive has a thermal conductivity of 6 W/mK as compared to a metal-based adhesive with a conductivity of 50–100 W/mK.

Accordingly, when a metal-based adhesive is incorporated into assembly 10 and the size of portion 103 of first terminal 101 is increased, then thermal resistance may be improved to at most 150° C./W, providing at least 38% improvement in thermal resistance over the prior art.

Figure 5:
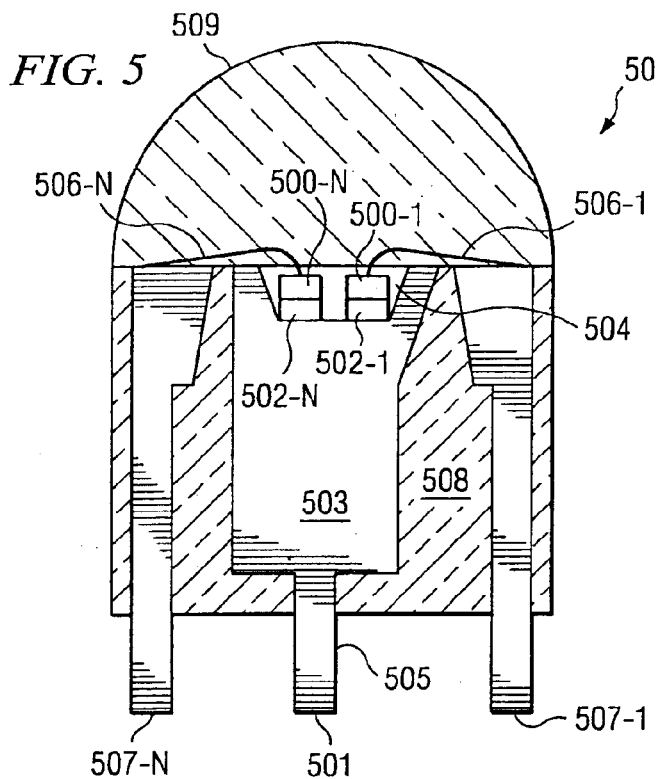
FIG. 5 depicts a light emitting device assembly according to an embodiment of the present invention.

Turning now to FIG. 5, light emitting device assembly 50 depicts an alternative embodiment of the present invention. Such assembly 50 differs from that depicted in FIG. 1 in that there are at least two second terminals 507-1 to 507-N. Accordingly, there is more than one LED chip 500-1 to 500-N housed in cavity 504 of first terminal 501 and attached via metal-based adhesive 502-1 to 502-N. Each LED chip 500-1 to 500-N will preferably be attached via electrical connection 506-1 to 506-N, usually gold wire, to corresponding second terminal 507-1 to 507-N. At least one encapsulation layer 508, 509 encases light emitting device assembly 50.

Thus, to improve thermal conductivity in the light emitting device assembly, the assembly relies on the metal-based adhesive, enlarged first terminal portion and encapsulation layer(s) as the primary outlets for heat dissipation prior to heat reaching the PCB, although other features may be incorporated to provide for additional heat dissipation. Because the metal-based adhesive is in direct contact with the LED, the adhesive has the first chance to dissipate heat that originates in LED chip 100. The heat moves out of LED 100 through the metal-based adhesive and into enlarged portion 103 of first terminal 101. As portion 103 of first terminal 101 is enlarged, there is more area for heat conduction and dissipation, and also as previously mentioned, if the first layer encapsulant has good thermal conductivity, another outlet for heat dissipation prior to reaching the PCB is available.

Figure 3:
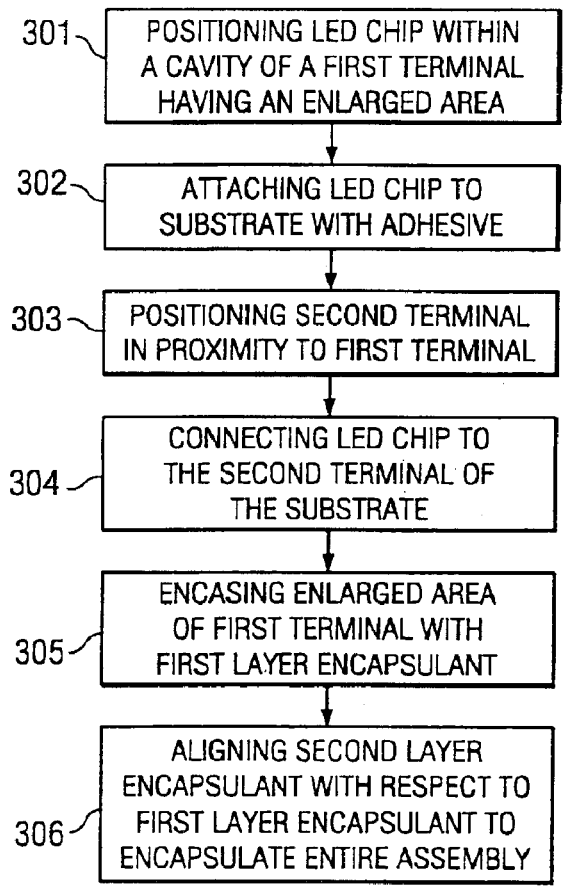
FIG. 3 depicts a flow diagram according to an embodiment of the present invention.

Turning now to FIG. 3, further embodiments of the present invention provide a method to enhance heat dissipation properties of a light emitting device assembly. This method provides for positioning a LED chip within a cavity of a first terminal portion having a width that is at least as wide as the LED chip with a vertical cross-sectional area of at least 30% of the total vertical cross-sectional area of the encapsulated assembly, as shown by process 301. Process 302 attaches the LED chip (such as chip 100) to the first terminal enlarged portion within the cavity of a substrate, preferably a leadframe. A metal-based adhesive is preferably used for bonding. A second terminal is positioned in proximity to the first terminal, as in process 303. Process 304 attaches a second terminal to the LED chip. Process 305 encases the enlarged portion of the first terminal with a first layer encapsulant, and process 306 aligns a second layer encapsulant with respect to the first layer encapsulant so as to encapsulate the entire assembly. Additionally, fillers may be incorporated into the first layer encapsulant to enhance thermal conductivity.

Figure 6:
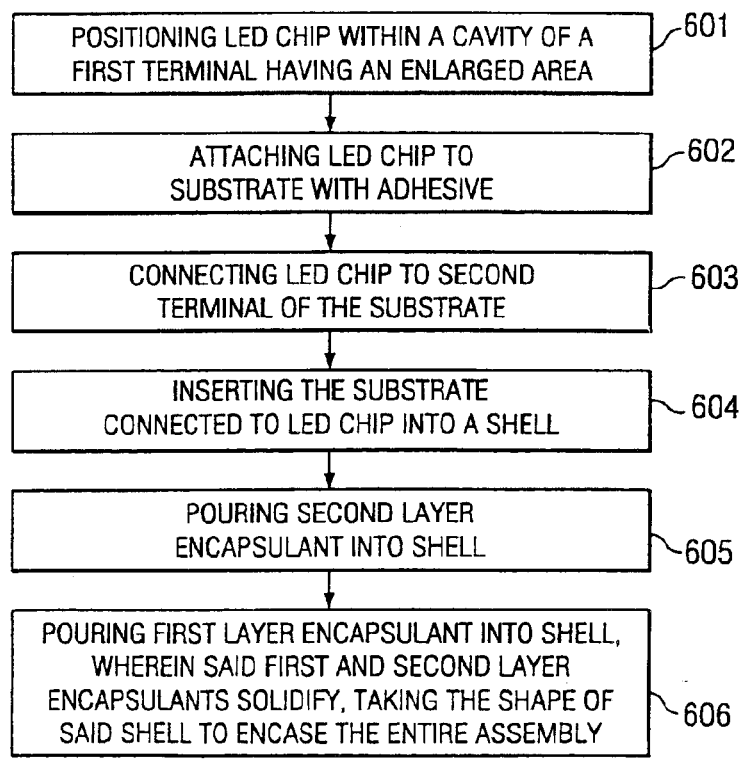
FIG. 6 depicts a flow diagram according to an additional embodiment of the present invention.

As an additional embodiment of the method of the present invention, FIG. 6 provides a method to enhance heat dissipation properties of a light emitting device assembly. Like the method depicted in FIG. 3, the method in FIG. 6 provides for positioning the LED chip within the cavity of a first terminal having a portion having a width at least as wide as the LED chip and a vertical cross-sectional area of at least 30% of the total vertical cross-sectional area of the encapsulated assembly, as shown by process 601. The LED chip is attached to the first terminal enlarged portion within the cavity of a substrate, preferably with a metal-based adhesive, as shown in process 602. In process 603, the LED chip is attached to the second terminal of the substrate. However, in process 604, the substrate connected to the LED chip is inserted into a shell or mold. Then, the second layer encapsulant is poured into the shell in process 605, and the first layer encapsulant is poured into the shell in process 606, these encapsulants solidifying and taking the shape of the shell in order to encase the remainder of the assembly.

Although the previous discussion has focused on the present invention as incorporated into a light emitting device assembly, additional embodiments provide for replacement of the LED chip with a laser diode or other preferred light emission devices. Like LEDs, laser diodes are complex semiconductors that convert electrical current into light and benefit from increased heat extraction and thus enhanced thermal conductivity available in the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light emitting device assembly comprising:
   at least one encapsulation layer encasing
   (a) a light emitting diode (LED) chip,
   (b) a substrate having two terminals, a first one of said two terminals having an electrical lead and a portion with a width at least as wide as said LED chip and a vertical cross-sectional area of at least 30% of the total vertical cross-sectional area of said encased assembly wherein said LED chip is located on an edge of said first terminal opposite said electrical lead, and
   (c) an adhesive that connects said LED chip to said first terminal of said substrate.

2. The light emitting device assembly of claim 1 wherein said adhesive is thermally conductive.

3. The light emitting device assembly of claim 1 wherein said adhesive is metal-based.

4. The light emitting device assembly of claim 1 wherein said portion of said first terminal is enlarged so as to protrude from said at least one encapsulation layer.

5. The light emitting device assembly of claim 4 wherein said portion of said first terminal is placed in contact with another metal surface so as to further increase thermal conductivity.

6. The light emitting device assembly of claim 1 wherein said portion of said first terminal is enlarged so as to be at least flush with an edge of said at least one encapsulation layer.

7. The light emitting device assembly of claim 1 wherein said portion of said first terminal has increased thickness to increase thermal capacity of said assembly and to sink more heat from said LED chip.

8. The light emitting device assembly of claim 1 wherein said at least one encapsulation layer is comprised of:

a first layer encapsulant with enhanced thermal conducting properties wherein said first layer encapsulant substantially encases said portion of said first terminal; and a second layer encapsulant which is attached to said first layer encapsulant on one side to encapsulate the remainder of said assembly.

9. The light emitting device assembly of claim 8 wherein said second layer encapsulant is optically clear.

10. The light emitting device assembly of claim 8 wherein said first layer encapsulant is selected from the group consisting of:

transparent material;

semi-transparent material;

opaque material; and polymer-based material.

11. The light emitting device assembly of claim 8 wherein said first layer encapsulant is comprised of fillers to enhance thermal conductivity.

12. The light emitting device assembly of claim 11 wherein said fillers are ceramic, glass or aluminum particles.

13. The light emitting device assembly of claim 1 wherein said adhesive is selected from a group comprised of at least:

a solder alloy;

a tin-based or gold-based alloy; and indium.

14. The light emitting device assembly of claim 1 wherein said vertical cross-sectional area of said portion of said first terminal is at least 0.014 in$^2$.

15. The light emitting device assembly of claim 14 wherein said at least one encapsulant layer encapsulates a 5 mm through-hole lamp.

16. A system comprising:

at least one encapsulation layer encasing an assembly, wherein said assembly includes (a) at least one light emitting diode (LED) chip;

(b) a first terminal, said first terminal entering said encapsulation layer through an edge and wherein said first terminal has an electrical lead and a portion with a width at least as wide as said LED chip wherein said portion of said first terminal extends so as to be at least flush with said edge of said at least one encapsulation layer and wherein said portion is disposed between said LED chip and said electrical lead;

(c) at least one second terminal, wherein the number of said at least one second terminal corresponds to the number of said at least one LED chip; and (d) at least one adhesive connecting said at least one LED chip to said first terminal.

17. The system of claim 16 wherein said at least one encapsulation layer is comprised of:

a first layer encapsulant with enhanced thermal conducting properties wherein said first layer encapsulant substantially encases said portion of said first terminal; and a second layer encapsulant which is attached to said first layer encapsulant on one side to encapsulate the remainder of said assembly.

18. The system of claim 16 wherein said assembly has a thermal resistance of at most 150° C/W.

* * * * *